United States Patent [19]

Kimmel et al.

[11] Patent Number: 4,493,954
[45] Date of Patent: Jan. 15, 1985

[54] ROTARY SWITCH WITH INTERNAL ROTOR INTERCONNECTING CIRCUIT PATHS FOR SURFACE CONTACTS

[75] Inventors: David J. Kimmel; John H. Lauterbach, both of Clearwater, Fla.

[73] Assignee: AMP Incorporated, Harrisburg, Pa.

[21] Appl. No.: 456,070

[22] Filed: Jan. 6, 1983

[51] Int. Cl.³ ............... H01H 19/58; H01H 21/78
[52] U.S. Cl. ................... 200/11 R; 200/8 A; 200/11 A; 200/11 G; 200/164 A
[58] Field of Search ............ 200/8 R, 8 A, 11 R, 200/11 A, 11 D, 11 DA, 11 G, 11 J, 11 K, 11 TW, 292, 264, 265, 155 R, 164 R, 165, 164 A

[56] References Cited

U.S. PATENT DOCUMENTS

| | | | |
|---|---|---|---|
| 1,127,808 | 2/1915 | Reynolds | 200/11 A X |
| 1,205,549 | 11/1916 | Kruesheld | 200/164 A X |
| 2,756,293 | 7/1956 | Bitler | 200/8 A |
| 3,011,041 | 11/1961 | Bakels | 200/8 A X |
| 3,141,076 | 7/1964 | Hill et al. | 200/164 R X |
| 3,263,033 | 7/1966 | Metzger | 200/11 K X |
| 3,632,911 | 1/1972 | Endou | 200/8 A X |
| 3,665,127 | 5/1972 | Lockard et al. | 200/11 TW |
| 3,699,279 | 10/1972 | Lockard et al. | 200/11 G |
| 3,723,674 | 3/1973 | Khitro et al. | 200/11 TW |
| 3,740,499 | 6/1973 | Standing | 200/8 A X |
| 3,809,830 | 5/1974 | Lockard et al. | 200/11 TW |
| 3,903,383 | 9/1975 | Marker | 200/11 TW |
| 4,034,178 | 7/1977 | Koppenheffer et al. | 200/293 |
| 4,163,879 | 8/1979 | Mayer et al. | 200/11 DA X |
| 4,218,593 | 8/1980 | Mayer et al. | 200/11 DA X |
| 4,243,853 | 1/1981 | Turner | 200/11 G |
| 4,275,279 | 8/1982 | Slavin et al. | 200/11 DA |
| 4,346,269 | 6/1982 | Wagatsuma et al. | 200/11 DA |

*Primary Examiner*—J. R. Scott
*Attorney, Agent, or Firm*—F. Brice Faller; Russell J. Egan

[57] ABSTRACT

Rotary switch includes a dielectric rotor with die cast conductive circuit paths therein which connect various surface contacts thereon. Rotor comprises first and second dielectric disc members facing internal surfaces which are sandwiched together. Internal surface on first disc member has channels therein which communicate with opposed surface via four circles of holes through the disc member. Holes through second disc member communicate between internal surface thereof and two circular bus channels on opposed surface. Metal die cast into sandwiched disc members forms inner circuit paths and surface contacts. Finished rotor is placed in housing with fixed contacts which make contact with different sets of surface contacts as rotor is rotated incrementally relative to housing. Two fixed contacts remain in contact with respective bus channels regardless of incremental position of rotor.

12 Claims, 13 Drawing Figures

ROTARY SWITCH WITH INTERNAL ROTOR INTERCONNECTING CIRCUIT PATHS FOR SURFACE CONTACTS

BACKGROUND OF THE INVENTION

The present invention relates to a rotary switch.

Most recent rotary switches of the prior art generally employ printed circuit boards having circuit patterns thereon which make electrical contact with arrays of electrical contacts which bear resiliently against the boards. See, for example, U.S. Pat. No. 4,346,269. The PCB's have two dimensional arrays of conductive circuit patterns and are generally round in shape for axial rotation relative to the fixed contacts, which provide both input and output from the switch. Another type of prior art switch employs contacts movable relative to a fixed PCB, as in U.S. Pat. No. 4,034,178. Insofar as the circuit patterns are confined to two dimensions, such switches are not practical for increasingly complex outputs. Further, large numbers of output contacts are required.

SUMMARY OF THE PRESENT INVENTION

The rotary switch of the present invention employs a disc shaped rotor having internal circuit paths which communicate with various surface contacts on opposite sides of the rotor. An alternate embodiment employs a drum shaped rotor having internal circuit paths which communicate with various surface contacts on the cylindrical surface. Both embodiments are intended to be mounted in a housing with fixed contacts therein; two fixed contacts are in contact with circular buses on the rotor regardless of the incremental position thereof relative to the housing. The remaining four fixed contacts provide a total of sixteen output combinations for each input bus. The rotor of the disc embodiment is only 0.33 inch diameter and an extremely compact switch is thus enabled. An additional advantage of the invention is provided by the large cross section of the die cast circuit paths therein, which pass considerably more current than conventional PCB traces. These and additional advantages will be apparent to one skilled in the art upon examination of the specification and drawings appended.

DETAILED DESCRIPTION OF THE PREFERRED EMBODIMENT

Figure 1:
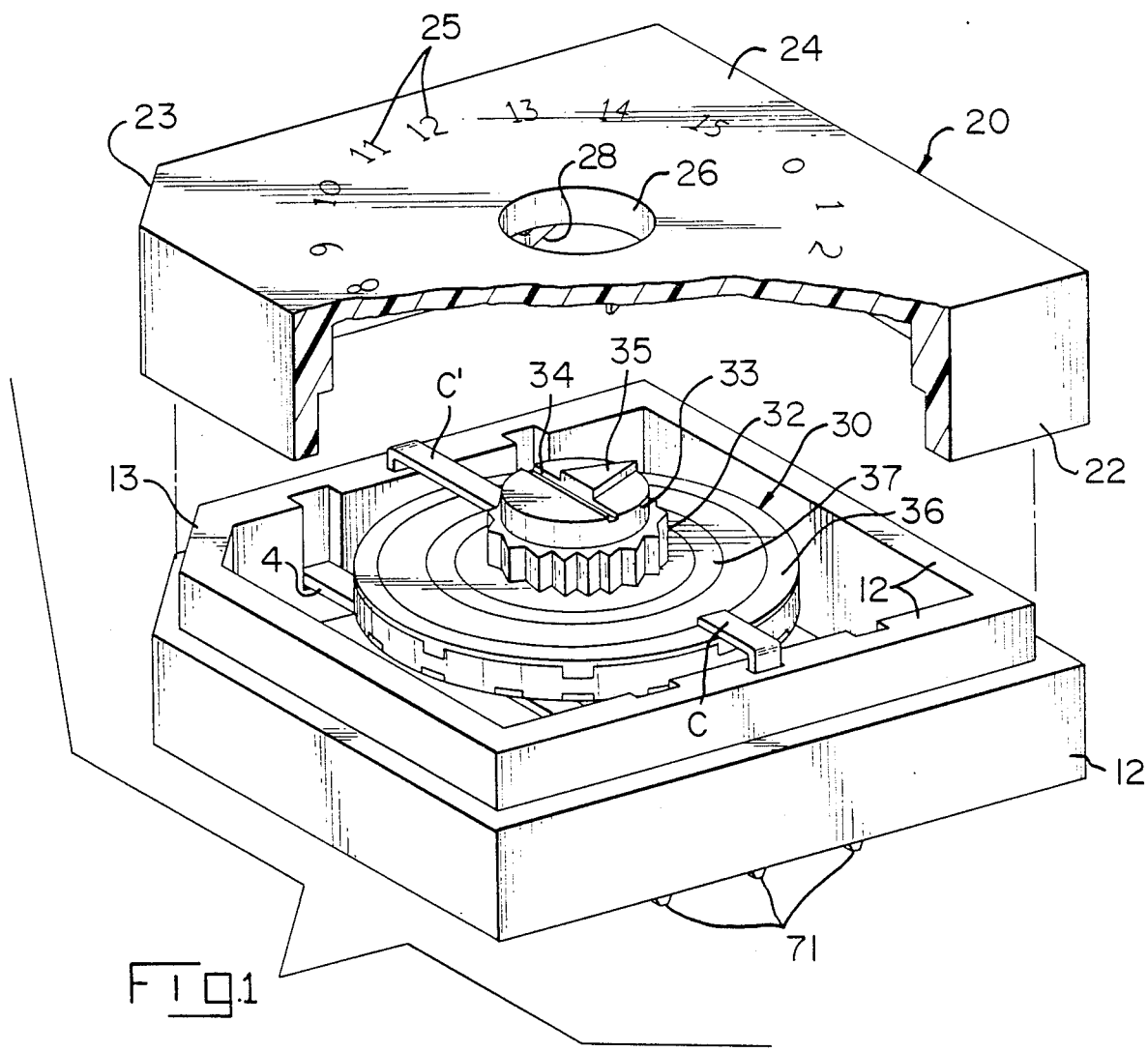
FIG. 1 is an exploded perspective of the switch.

FIG. 1 is a perspective of the rotary switch of the present invention with cover 20 exploded from housing 10 to expose rotor 30. The rotor 30 has a gear 32 which engages spring 28 to permit only incremental movement of rotor 30 relative to the housing 10 and cover 20; a journal 33 above gear 32 is closely received in circular aperture 26 which acts as a bearing. Indicator arrow 35 will point toward one of sixteen indicator numerals 25 on top surface 24 to indicate a discrete switch position; screw driver slot 34 is provided to facilitate rotation of the rotor 30. Housing 10 has sidewalls 12 and a beveled corner 13 which cooperates with beveled corner 23 on cover 20 as sidewalls 22 are mated to sidewalls 12 during assembly. Fixed contacts C and C' are fitted in walls 22 and contact inner bus 36 and outer bus 37 respectively. Of fixed contacts 1, 2, 4, 8 which contact the bottom of rotor 10, only contact 4 is visible in this view. All fixed contacts have legs 71 which protrude from housing 10 and are received in the plated through holes of a printed circuit board.

Figure 2:
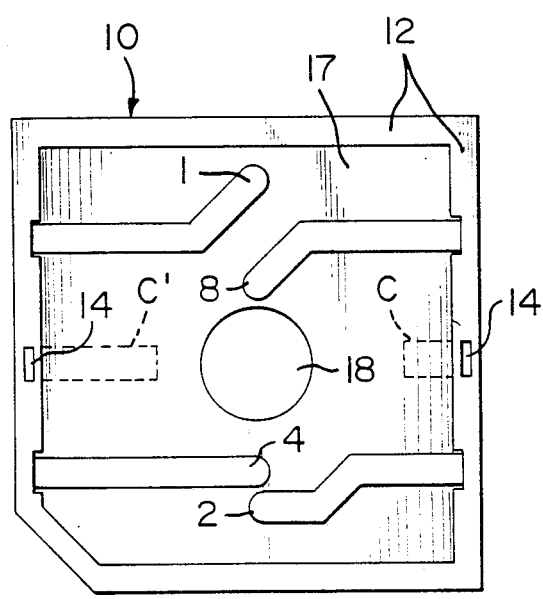
FIG. 2 is a plan view of the housing prior to installation of the rotor.
Figure 3:
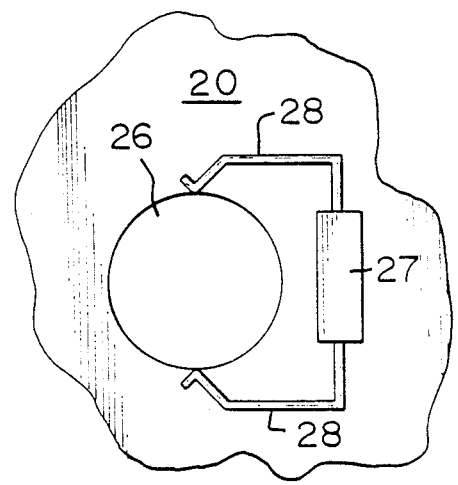
FIG. 3 is a plan view of the inside of the cover for the switch.

FIG. 2 is a plan view of the housing prior to installation of rotor 10. Here contacts 1, 2, 4, and 8 which are fit into sidewalls 12 are plainly visible. Contacts C and C' (FIG. 1) will be fit into apertures 14 after installation of the rotor in circular aperture 18, which also acts as a bearing. The center of aperture 18 is the axis of rotation of the rotor and it is important to note that the tips of fixed contacts 1, 2, 4 and 8 lie on mutually different radii from this axis. FIG. 3 is a depiction of springs 28 which are fixed in mounting block 27 which is molded integrally with cover 20. The springs 28 engage the gear 32 (FIG. 1) to assure incremental movement.

Figure 4:
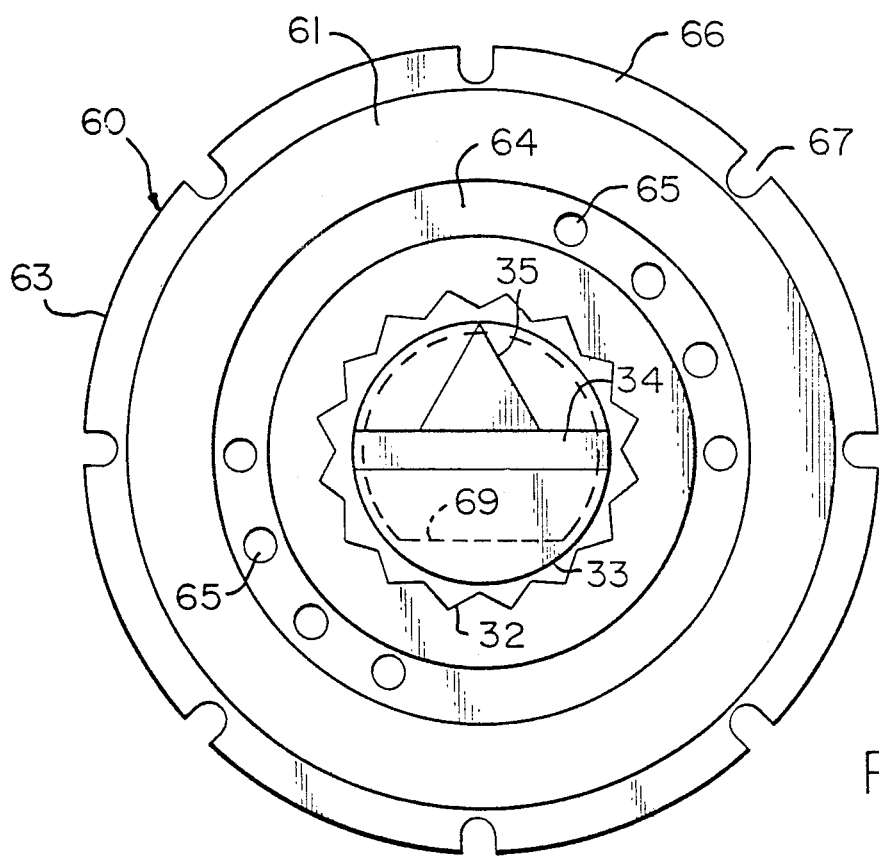
FIG. 4 is a plan view of the top disc member.
Figure 5:
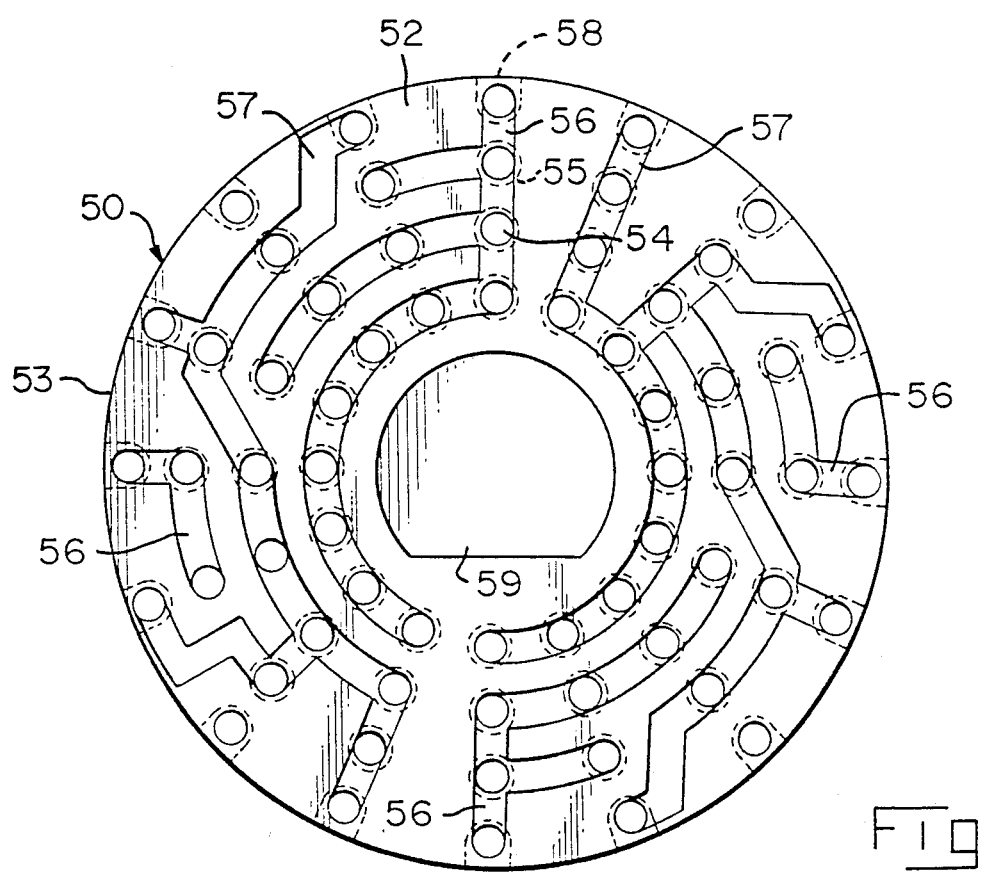
FIG. 5 is a plan view of the bottom disc member.

The rotor 10 shown in FIG. 1 is assembled from first and second dielectric disc members 50, 60 which are depicted in FIGS. 5 and 4 respectively. FIG. 4 is a plan view of second disc member 60 which has integral gear 32, journal 33, slot 34, and arrow 35 as shown in FIG. 1. A keying member 69 is shown in phantom on the surface opposite top surface 61. Second planar surface 61 is interrupted by inner bus channel 64 which is concentric to outer bus channel 66 which flanks the circumferential surface 63 of second disc member 60. The inner channel 64 has through holes 65 to the opposite surface of the disc. The holes 65, eight total in two opposed groups, are spaced at 22.5°, which is the degree of rotation of incremental movement of the assembled rotor. The outer channel 66 is interrupted by notches 67 through to the opposite surface. The notches 67, eight total, are uniformly spaced at 45° about the periphery of the disc member 60.

FIG. 5 is a plan view of the first disc member 50 looking at first internal surface 52, which is generally planar and interrupted by channels 56, 57 which interconnect various through holes 54 communicating with the opposite surface of the disc member 50. Note that the holes 54 (sixty-four total) lie on four circles concentric with the axis of the disc member 50; there are sixteen holes on each concentric circle. The holes further lie on radii common to each circle; there are sixteen such radii spaced at 22.5°. Various of holes 54 are interconnected by channels 56, 57 in internal surface 52; holes spaced at 0°, 45°, 90°, 135°, 180°, 225°, 270°, 315° and 360° about the periphery are either alone or connected by channels 56. Holes spaced at 22.5° and 45° intervals thereafter on the periphery are interconnected by channels 57. Keying hole 59 is profiled to receive keying member 69 from above.

Figure 6:
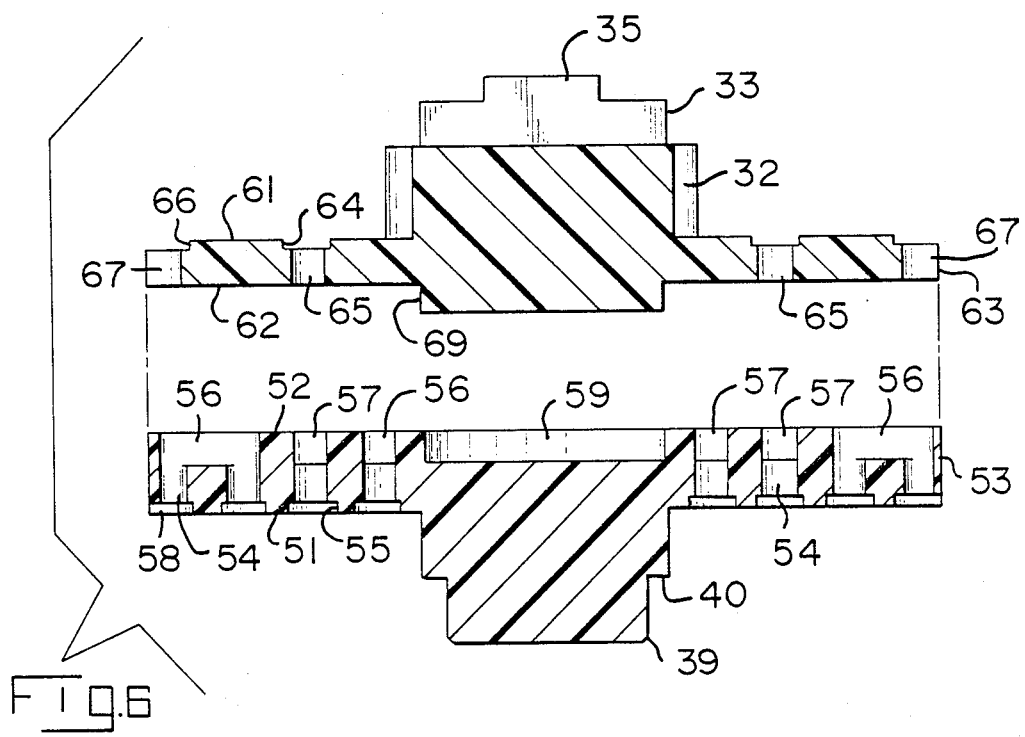
FIG. 6 is a section view of the disc members prior to assembly and die casting.

Referring now to FIG. 6, as well as FIGS. 4 and 5, the disc members 50, 60 are assembled by sandwiching together respective internal surfaces 52, 62 so that the keying hole 59 receives the keying member 69 in the proper orientation. The peripheral notches 67 are thus aligned with every other hole 54 about the periphery of first disc member 50 so that conductor placed in outer bus channel 66 will communicate with channels 56 so that half the holes 54 (thirty-two in this embodiment) will be at like polarity. The through holes 65 in second disc member 60 align with holes 54 in channels 57 so that conductor placed in inner bus channel 64 will communicate with such holes 54 (thirty-two total) so that they also may be maintained at like polarity. Note that holes 54 have countersinks 55 in first planar surface 51 and notches 58 extending to the circumferential surface 53.

Figure 7:
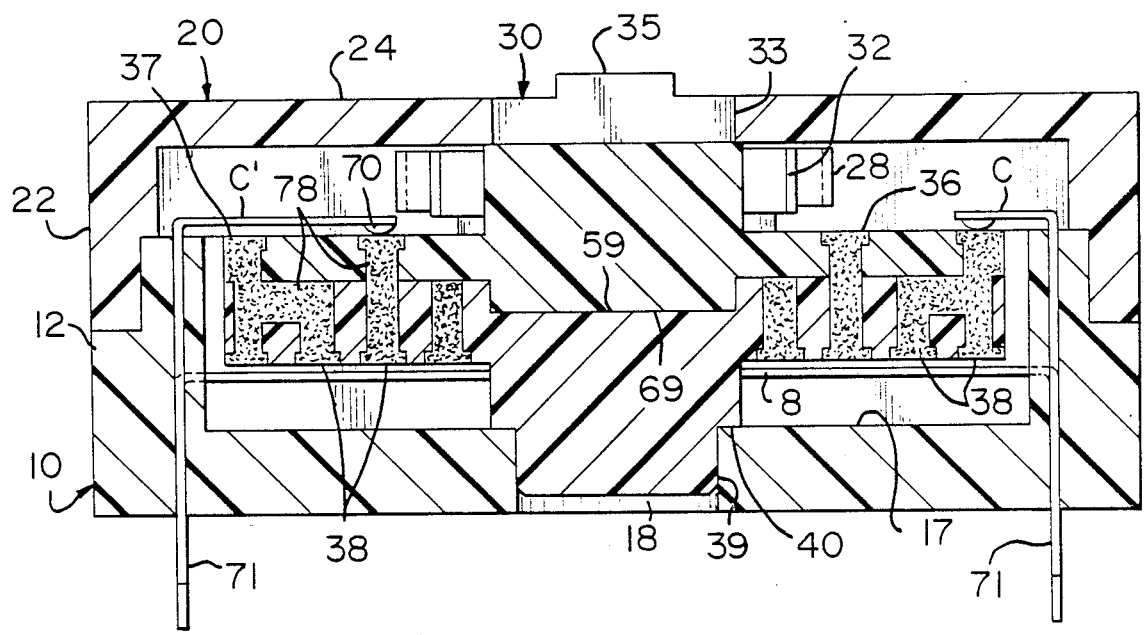
FIG. 7 is a cross section of the rotor in the finished switch.

The FIG. 7 cross section, taken through the fourth and twelfth positions of the finished switch, best depicts the internal circuit paths 78. The rotor 10 is finished by sandwiching together disc members 50, 60 and die casting zinc into notches 58 so that holes 54, 65 and channels 56, 57, 64, and 66 fill with metal. All surface contacts including inner and outer buses 36, 37 and discrete contacts 38 are thus created. Note that the continuity of metal between countersinks 55 and channels 64, 66 (FIG. 6) serves to mechanically hold members 50, 60 together. Contacts 1 and 8 extend to points behind the rotor 30 and make contact with discrete surface contacts 38 on a radius opposite the viewer. The power contacts C, C' make contact with outer bus 37 and inner bus 36 respectively. In operation only one of contacts 36, 37 is energized so that only half of discrete surface contacts 38 are energized. The polarity of the switch is changed by energizing the opposite contact, as will be apparent by studying the switch structure or by reference to the truth tables of FIGS. 9A and 9B.

Figure 8:
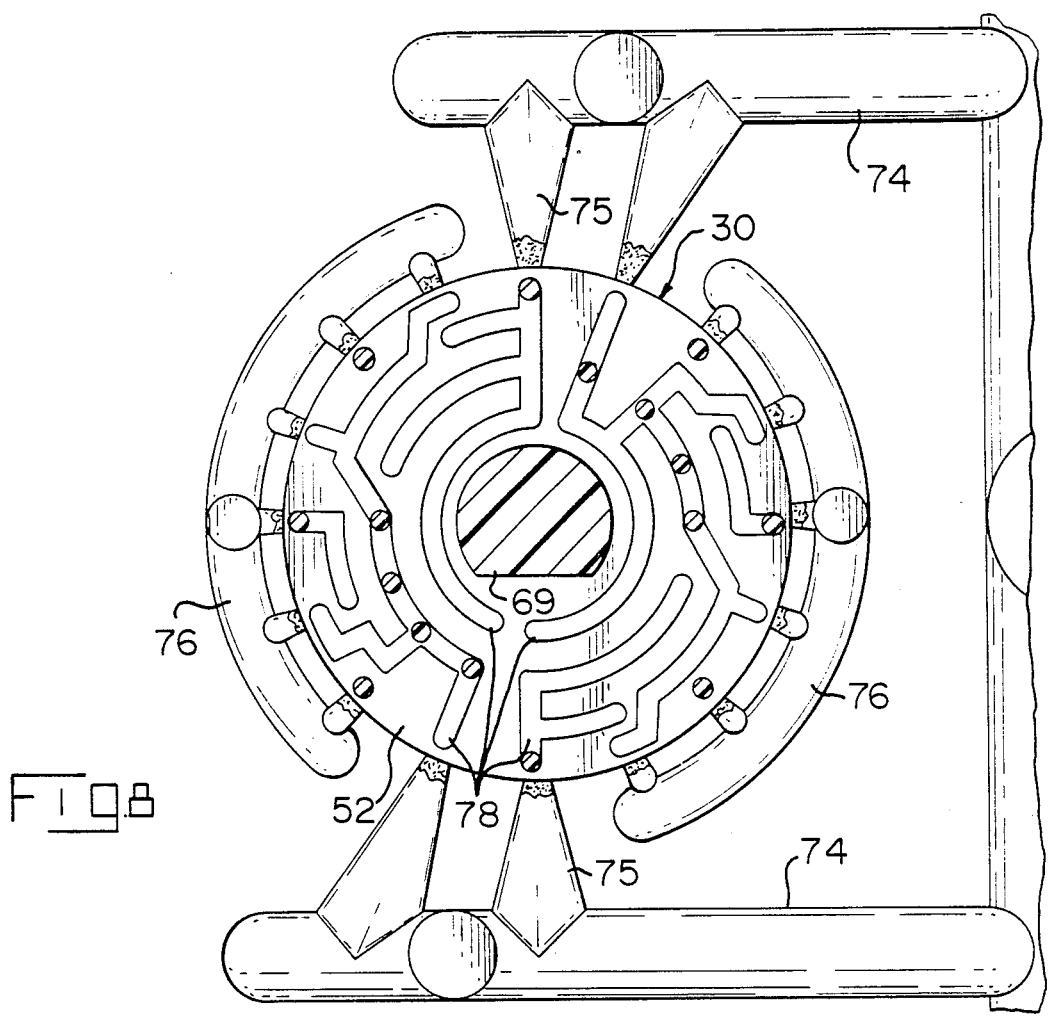
FIG. 8 is a section view of the rotor after die casting, taken between disc members.

FIG. 8 is a cross section taken through disc type rotor 30, exposing internal surface 52 of first disc member 50, after casting and prior to trimming away metal which was introduced via the runners and sprues, represented by members 74 and 75 respectively. The hot zinc is introduced through four of notches 58 (FIGS. 5 and 6), forced through channels 56 and 57 to form circuit paths 78, and exits through the remaining twelve notches into an exhaust runner represented by member 76. The dies are opened, the rotor 30 and appurtenant metal are removed therefrom, and the peripheral metal is trimmed to yield the rotor heretofore described. Some plating may be desirable to prevent oxidation of zinc on the surfaces of the rotor.

Figure 9A:
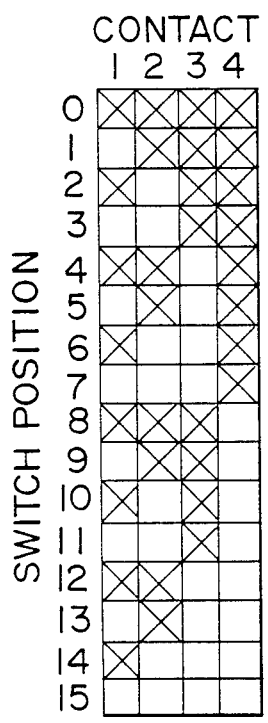
FIGS. 9A and 9B are truth tables.

FIG. 9A is a "truth table" indicating which of contacts 1, 2, 4, 8 are energized in the various switch positions when common leg C is energized. Electrically disconnecting leg C and connecting leg C' results in the truth table depicted in FIG. 9B. Note in both FIGS. 9A and 9B that if the contacts 2, 4 are moved 180° from the position relative to housing 10 shown in FIG. 2, the tables will remain the same. Likewise it is possible to move contact 1 any multiple of 45°, contact 2 any multiple of 90°, and contact 4 180° without changing the outputs shown in FIGS. 9A and 9B. Thus various contact arrangements other than that shown in FIG. 2 are possible.

Figure 10:
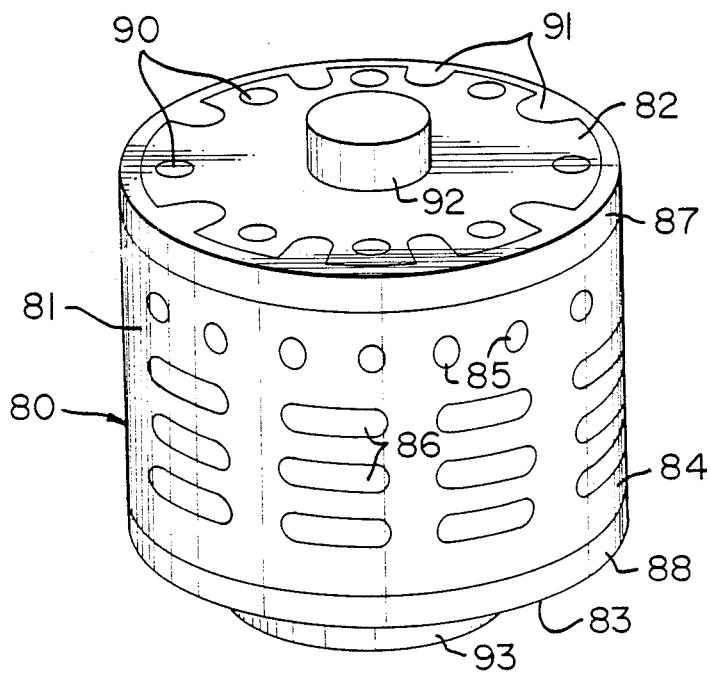
FIG. 10 is a perspective of an alternative embodiment rotor.

FIG. 10 is a perspective of rotor 80 which represents an alternative embodiment. The rotor 80 is in the form of a drum or cylinder having a first end surface 82, second end surface 83, and a circumferential cylindrical surface 84. A first journal 92 on first end surface 82 and a second journal 93 on second end surface 83 serve as mounting means within a suitable housing and define the axis of rotation of the rotor 80. The surface 84 has sixteen equally spaced circular surface contacts 85 lying on a circle, the contacts 85 further lying on sixteen lines which are normal to the axis of rotation. There are also three sets of elongate surface contacts 86 arranged on three respective circles normal to the circle of contacts 85. Each contact 86 parallels two circles 85 and spans two of the imaginary lines paralleling the axis of the rotor 80. Circular buses 87, 88 lie at the circumference of respective ends 82, 83; the buses are rectangular in cross section and thus face both respective ends 82, 83 as well as circumferential surface 84. Thus contacts C, C' as in the first described embodiment may be arranged to contact respective buses 87, 88 on either respective ends 82, 83 or surface 84. Other fixed contacts would be arranged to contact surface contacts 85, 86 along the four parallel circles, and could be arranged in a single line, 180° apart, or staggered 90° as described for the disc embodiment. Discrete end contacts 90 represent the ends of metal filled bores which communicate with bus 88 at the other end 83, while contacts 91 are connected to bus 87 and represent the ends of metal filled bores which do not contact bus 88. Half of each set of contacts 85, 86 communicate with metal filled bores in touch with bus 87 while the remaining contacts 85, 86 communicate with metal filled bores in touch with bus 88.

Figure 9B:
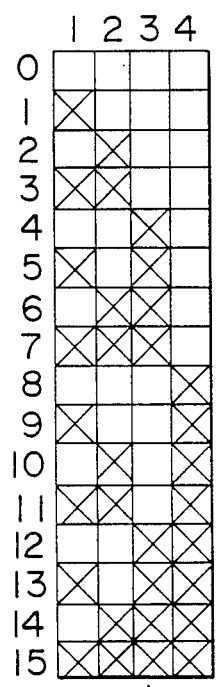

Note that rotor 80 is represented by the same truth tables as in FIGS. 9A and 9B, and it may be assumed for simplicity that all fixed contacts C, 1, 2, 4, 8, and C' contact the rotor 80 in a single line along surface 84.

Figure 11:
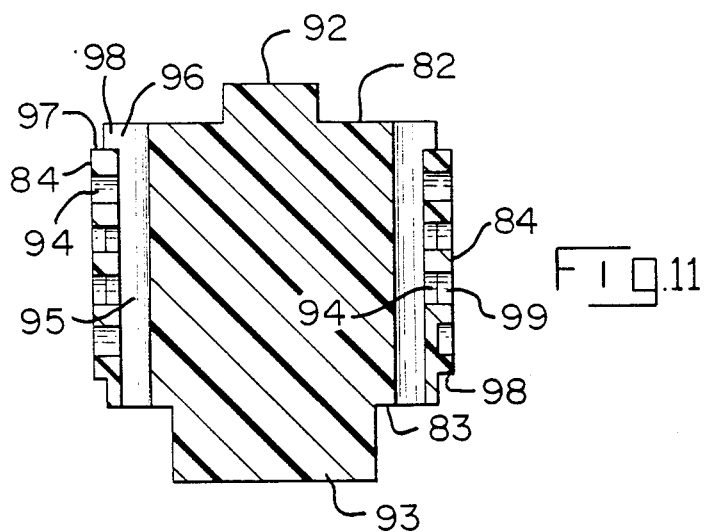
FIG. 11 is a cross section of the dielectric member of the alternative embodiment rotor.

The rotor 80 is manufactured from a molded dielectric cylinder 81 depicted in cross section in FIG. 11; the cross section is taken along a plane through the "zero" and "eight" positions and shows the features necessary for casting metal to form inner circuit paths which connect various of the surface contacts in the finished rotor. Circular edge channels 97, 98 at respective ends 82, 83 provide the profile for buses 87, 88 while bores 95 and apertures 94 provide paths for metal flow between various surface contacts formed therein as well as elongate surface slots 99. In this cross section the circular edge channel 97 communicates with bores 95 via notches 96; like notches at radially adjacent positions communicate between radially adjacent bores 95 and channel 98.

Figure 12:
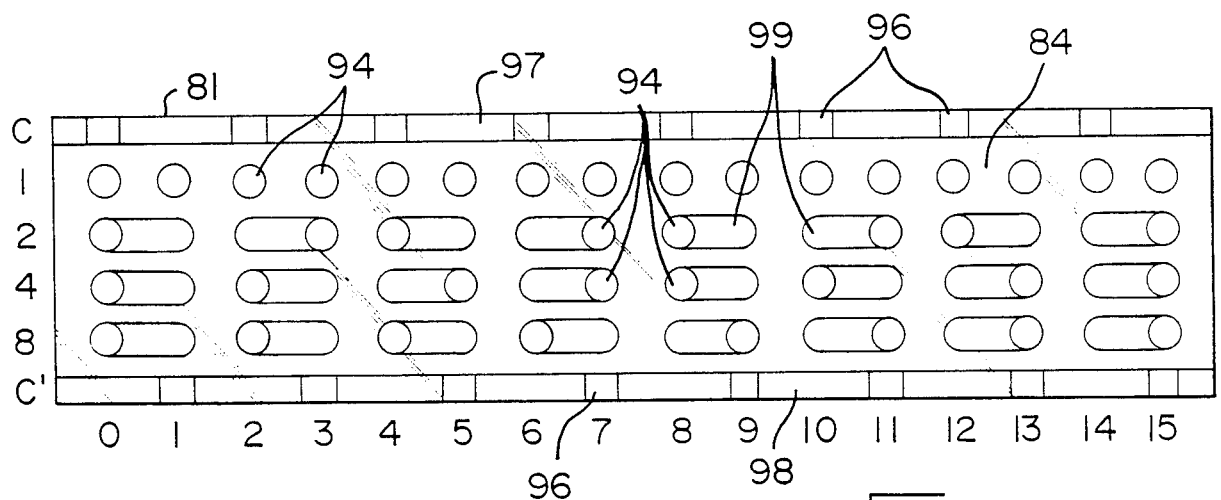
FIG. 12 is a plan view of the circumference of the alternative embodiment rotor.

FIG. 12 is a view of the circumference of dielectric cylinder and further clarifies the geometry prior to casting metal therein. Notches 96 in edge channel 97 alternate with notches 96 in edge channel 98 and likewise communicate with alternate bores 95 (FIG. 11) spaced 22.5° apart in the cylinder 81. Apertures positioned along contact circle 1 communicate alternately with either top bus channel 97 or bottom bus channel 98. Slots along contact circle 2 communicate alternately with the top channel 97 and bottom channel 98. Slots along contact circle 4 communicate in pairs alternately with top channel 97 and bottom channel 98, while slots along contact circle 8 communicate in groups of four adjacent slots with either top channel 97 or bottom channel 98.

The alternative embodiment rotor 80 is finished by placing dielectric member 81 into a die casting apparatus and introducing zinc via runners, sprues, and exhaust runners as in the first described embodiment. The manufacture of a suitable housing and contacts will be readily apparent to one skilled in the art.

The above described embodiments are illustrative and not intended to limit the scope of the claims which follow.

We claim:

1. A rotary switch of the type comprising:
a housing of insulative material defining a cavity;
a substantially cylindrical rotor mounted for relative rotation within said cavity of said housing;
a plurality of fixed contacts mounted to extend radially into said cavity and from said housing;
a plurality of integral surface contacts in said rotor which selectively engage said fixed contacts in said housing, incremental rotation of said rotor causing different sets of surface contacts to selectively engage said fixed contacts, characterized in that said rotor is a disc having opposed first and second planar surfaces, said first planar surface having a plurality of said surface contacts thereon, said surface contacts lying on circles concentric with the central axis of said disc, said surface contacts on said circles further lying along radii common to each said circle, a number of said fixed contacts corresponding to the number of said circles making engagement with said surface contacts along said radii, said radii corresponding to the number of incremental positions of said rotor, and circuit paths extending through and within said rotor interconnecting respective surface contacts on the faces of said rotor.

2. A rotary switch as in claim 1 characterized in that at least one of said surface contacts is a circular bus which is in constant engagement with a certain one of said fixed contacts regardless of the incremental position of said rotor, said circular bus being electrically continuous with at least some of said remaining surface contacts by means of said circuit paths.

3. A rotary switch as in claim 1 characterized in that at least one surface contact is a circular bus on said second planar surface, said bus being in engagement with a certain one of said fixed contacts regardless of the incremental position of said rotor, said bus being electrically continuous with at least some of said surface contacts on said first planar surface by means of said circuit paths.

4. A rotary switch as in claim 3 characterized in that two of said surface contacts are said circular buses on said second planar surface, each said bus being electrically continuous with half of the surface contacts on said first planar surface.

5. A rotary switch as in claim 3 characterized in that said disc comprises first and second dielectric disc members, said first planar surface lying on said first disc member, said second planar surface lying on said second disc member, said first disc member having a first internal surface opposite said first planar surface, said second disc member having a second internal surface opposite said second planar surface, at least one of said internal surfaces having channel means therein, said first and second internal surfaces being sandwiched together, said channel means communicating with said surface contacts via holes through said disc members, said circuit paths being disposed in said channels and said holes.

6. A rotary switch as in claim 5 characterized in that said circuit paths are die cast metal.

7. A rotary switch as in claim 6 characterized in that said die cast metal serves to hold said disc members together, said metal being cast while said disc members are sandwiched together.

8. A rotary switch as in claim 1 characterized in that said rotor is in the form of a cylinder having opposed first and second end surfaces and a cylindrical surface therebetween, at least some of said surface contacts lying on said cylindrical surface on circles concentric with the axis of said rotor, said surface contacts on said circles further lying along lines normal to the axis of said rotor, a number of said fixed contacts corresponding to the number of said circles making contact with a like number of said surface contacts lying on a like number of respective circles, said lines corresponding to the number of incremental positions of said rotor.

9. A rotary switch as in claim 8 characterized in that at least one surface contact is a circular bus on at least one of said end surfaces concentric with said axis, said bus being in contact with a certain one of said fixed contacts regardless of the incremental position of said rotor, said bus being electrically continuous with at least some of said surface contacts on said first planar surface by means of said circuit paths.

10. A rotary switch as in claim 9 characterized in that said rotor comprises a dielectric cylinder member having bores passing between said first and second end surfaces, said bores communicating with said surface contacts via apertures, said circuit paths being disposed in said bores and said holes.

11. A rotary switch as in claim 10 characterized in that at least some of said bores communicate with said at least one bus, whereby said bus is continuous with at least some of said surface contacts.

12. A rotary switch as in claim 11 characterized in that two of said surface contacts are circular buses, half of said bores communicating with each said bus.

* * * * *